(12) United States Patent
Charles et al.

(10) Patent No.: US 6,420,247 B1
(45) Date of Patent: Jul. 16, 2002

(54) METHOD OF FORMING STRUCTURES ON A SEMICONDUCTOR INCLUDING DOPING PROFILES USING THICKNESS OF PHOTORESIST

(75) Inventors: Alain Charles; John G. Maltabes, both of Dresden (DE)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/546,402

(22) Filed: Apr. 10, 2000

(51) Int. Cl.⁷ ................. H01L 21/8238; H01L 21/8234; H01L 21/76; H01L 21/425
(52) U.S. Cl. ................ 438/514; 438/200; 438/275; 438/430
(58) Field of Search ................. 438/200, 241, 438/258, 275, 430, 514

(56) References Cited

U.S. PATENT DOCUMENTS

| | | |
|---|---|---|
| 2,535,156 A | 12/1950 | Pastore et al. |
| 4,035,226 A | 7/1977 | Farber et al. |
| 4,231,811 A | 11/1980 | Somekh et al. |
| 5,403,685 A | 4/1995 | Vidusek et al. |
| 5,470,774 A | * 11/1995 | Kunitou |
| 5,536,669 A | * 7/1996 | Su et al. |
| 5,627,091 A | * 5/1997 | Hong |
| 5,741,624 A | 4/1998 | Jeng et al. |
| 5,837,405 A | * 11/1998 | Tomofuji et al. |
| 5,906,911 A | 5/1999 | Cote |

FOREIGN PATENT DOCUMENTS

EP 0731387 A2 9/1996

OTHER PUBLICATIONS

Flores et al., "Photoresist Thin Film Effects on Alignment Process Capability," Proc., SPIE vol. 1927, pp. 366–380, Aug. 1993.

* cited by examiner

*Primary Examiner*—John F. Niebling
*Assistant Examiner*—Ron Pompey
(74) *Attorney, Agent, or Firm*—James L. Clingan, Jr.

(57) ABSTRACT

A method of forming structures on a semiconductor wafer (1) by lithographic and subsequent ion implant steps comprises the steps of: deposition of a resist layer (5) on a surface of said semiconductor wafer (1), exposing said resist layer to light of a predetermined wavelength through a reticle and an optical system so as to form an image of said reticle on said semiconductor surface, developing and cleansing said surface of said semiconductor wafer (1) so as to remove at least partly said resist layer (5) depending on whether or not said resist layer had been exposed, implantation of ions so as to determine the conductivity of said semiconductor in said cleansed areas of said semiconductor surface. In order to allow the preparation of the resist for all doping profiles in a single processing step it is suggested that the surface energy of the resist (5) vs. the semiconductor (1) is chosen so as to accomplish a conglomeration of the resist depending on the density of the structures (2, 4) on the semiconductor surface.

6 Claims, 1 Drawing Sheet

METHOD OF FORMING STRUCTURES ON A SEMICONDUCTOR INCLUDING DOPING PROFILES USING THICKNESS OF PHOTORESIST

FIELD OF THE INVENTION

The present invention relates to a method of forming structures on a semiconductor wafer by lithographic and subsequent ion implant steps. In particular the lithographic steps are photo-lithographic steps.

BACKGROUND OF THE INVENTION

The general method of doping a semiconductor is based on preparing a mask by lithographic steps and subsequently implanting ions in the semiconductor so as to determine its conductivity which depends on the doping profile and the doping level in specific areas.

If different areas with different doping characteristics are desired in a semiconductor the same implantation procedure must be carried out repeatedly, each time with a new reticle so as to expose, develop and etch another area on the semiconductor for the subsequent implantation procedure. This is time consuming and costly.

It is therefore desirable to have a method of forming several implant resist layers with which the preparation of the resist for all doping profiles is feasible in a single processing step.

DETAILED DESCRIPTION OF THE INVENTION

Figure 1:
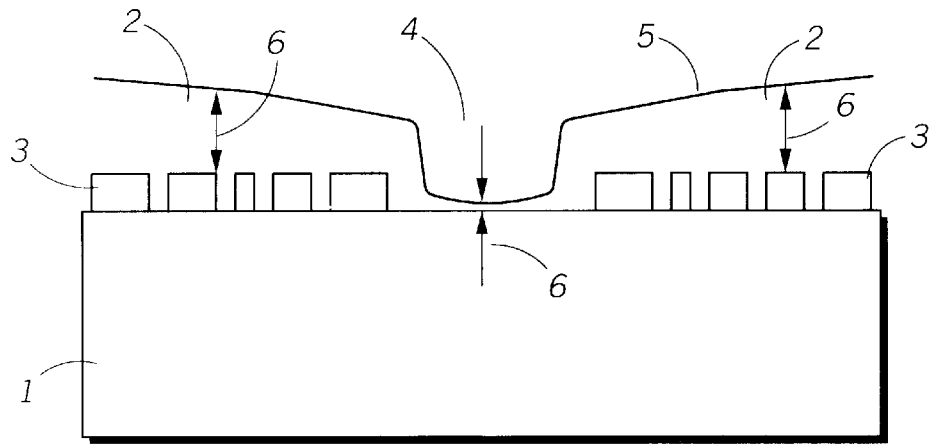
FIG. 1 shows the principal sequence of layers and structures on a semiconductor with a resist coating.

The principle of the present invention is based on generating a appropriate remaining resist thickness after the lithographic step at different locations. The different resist thickness enables to control the depth of implanted areas. Also the lateral extension of the implanted areas may be adjusted in a subsequent diffusion step (drive in process).

To prepare a resist layer of appropriate thickness, which depends on the structure on the semiconductor, the invention takes advantage of that the surface energy of a resist layer depends on the semiconductor surface on which the resist layer is deposited. I.e. the different conglomeration properties of a resist layer depending on the structure density underneath are exploited: in general drops of the resist show a smaller curvature radius at sites of denser structures on the semiconductor surface than at sites with less dense structures. The radius depends on the surface energy of the resist vs. the semiconductor surface. Thus, with a suitably chosen resist the curvature radius of a single drop of resist can be determined, viz. depending on the resist more material will concentrate on denser areas of the semiconductor than on areas with wider gaps between adjacent structures on the semiconductor.

According to the present invention the method of forming structures on a semiconductor wafer by lithographic and subsequent ion implant steps comprises the steps of: deposition of a resist layer on a surface of said semiconductor wafer, exposing said resist layer to light of a predetermined wavelength through a reticle and an optical system so as to form an image of said reticle on said semiconductor surface, developing and cleansing said surface of said semiconductor wafer so as to remove at least partly said resist layer depending on whether or not said resist layer had been exposed, implantation of ions so as to determine the conductivity of said semiconductor in said cleansed areas of said semiconductor surface, wherein the surface energy of the resist vs. the semiconductor is chosen so as to accomplish a conglomeration of the resist depending on the density of the structures on the semiconductor surface.

Preferably the resist comprises at least one of spin on glass, polyimide, and low k dielectrics and is applied with a spin coater.

In further preferred embodiments of the invention the resist is etched back so as to tailor its thickness to the actual implantation requirements, and auxiliary non-functional structures on the semiconductor surface are formed so as to determine the structure density, respectively.

In particular the resist is a photosensitive resist.

Further features and advantages of the invention emerge from the following description of a preferred embodiment, which is given as an example only, to which the invention is not limited.

In general for forming structures on a semiconductor wafer 1 by lithographic and subsequent ion implant steps a resist layer 5 on a surface of said semiconductor wafer 1 is deposited. The resist 5 serves as the material by which it is possible to optically create a desired pattern on the semiconductor surface for further processing steps. In these following processing steps resist 5 is exposed to light of an appropriate wavelength (visible, X-ray, etc.) and of appropriate intensity. Irradiated areas of the resist 5 are removed afterwards so as to leave windows open on the semiconductor surface, through which ions are implanted into the semiconductor bulk, which will be described in greater detail below.

The upper surface of the resist 5 (before exposure and removal) is shown with a curved line in FIG. 1. At this stage of the processing the shown semiconductor is already provided with a structure, which comprises a dense area 2 with numerous structure elements 3 and a less dense area 4 with almost no elements. These structures and areas 2, 3, and 4 have been prepared in processing steps before the resist 5 is deposited on the semiconductor 1. The steps of preparing the structure elements 3 are well known in the art and will therefore not be considered here any further.

After coating the semiconductor 1 with said resist 5 said resist layer is exposed to light of a predetermined wavelength and intensity through a reticle and an optical system (not shown) so as to form an image of said reticle on said semiconductor surface. Subsequently the resist 5 is developed and said surface of said semiconductor wafer 1 is cleansed so as to remove at least partly said resist layer 5 depending on whether or not said resist layer had been exposed. Then the semiconductor is bombarded with ions substantially all over its surface. However, only in the cleansed areas on said semiconductor surface ions penetrate into the semiconductor itself, whereas in the areas covered by said resist 5 the ions are absorbed by the resist 5 before they reach the semiconductor bulk. Thus, only in the areas cleansed from the resist 5 the conductivity of said semiconductor is affected by the ion bombardment.

However, with the prior art the problem is that the dose of the ion implantation is more less equal over the whole wafer 1. In general it is not possible to create an intended non-equal distribution of the ion implantation dose over the semiconductor but with several, distinct masks each defining a separate pattern of areas where ions are to be implanted. This is expensive in terms of time and hardware.

The inventor proposes instead to modulate the thickness of the remaining resist so as to create a spatially varying ion transmittance over the surface of the wafer 1. In other words the different resist thickness allows to control the implant depth or lateral diffusion based on the drive in process.

The modulation of the resist thickness can be obtained by adjusting the surface energy of the resist vs. the semiconductor properly. Especially, the surface tension between resist 5 and surface 1 is chosen so as to accomplish a conglomeration of the resist 5 depending on the density of the structures 2, 4 on the semiconductor surface 1.

The resulting distribution of the resist 5 over the semiconductor surface 1 is depicted in FIG. 1. As can clearly be seen the thickness 6 (double arrow) of the resist 5 is greater in the areas 2 with densely arranged structure elements 3 than the thickness 6 (two arrows) in areas 4 which are rather void. In the transition between the areas 2 and 4 the resist 5 provides rather a steep slope.

The difference in the thickness 6 of the resist 5 between dense areas 2 and less dense areas 4 due to the different surface tension is exploited by the invention for creating ion implantation shields with location dependent absorption coefficients: in the already worked on areas 2 (i.e. with the resulting elements 3) the ions would not reach the semiconductor but would be absorbed by the resist 5; in the not yet worked on areas 4, however, ion implantation would be successful, since the resist layer 5 is to thin as to absorb a substantial amount of ions, thus resulting in the desires doping profile of the semiconductor underneath the resist 5. Clearly, the absorption rate of the ions in the resist 5 and/or the doping depth in the semiconductor 1 depends not only on the thickness 6 of the resist but also on the energy of the ions, the doping species, and the components of the resist 5. Preferably the resist 5 comprises at least of one of spin on glass, polyimide, and low k dielectrics. Moreover, the resist 5 is applied with a spin coater so as to attain a resist surface as even as possible.

In some cases it may be that the distribution of the thickness 6 over the surface is not yet satisfactory after the above processing steps. In a preferred embodiment of the invention, therefore, an additional etch back process is carried out after coating the semiconductor 1 with the resist 5. Thus, the resist thickness is "tailored" so as to adjust the ion transmittance of the remaining resist. In other words, the thickness in the void areas 4 my be further reduced, whereas the thickness in the dense areas 2 is hardly affected by etching back as to what the overall ion absorption is concerned.

As another way to adjust the thickness of the deposited resist layer auxiliary non-functional structures (not shown) are formed on the semiconductor surface. By these structures the structure density on the semiconductor surface is increased such that in the areas with non-functional structures e.g. more of the resist remains and the implantation depth in the subsequent ion implantation step is reduced between the elements of the non-functional structures.

The invention has been described above generally referring to a resist layer, which is deposited on the semiconductor surface. It is to be understood, however, that the resist is in particular a photosensitive resist that is exposed to light in the visible range of the electromagnetic spectrum.

Figure 2:
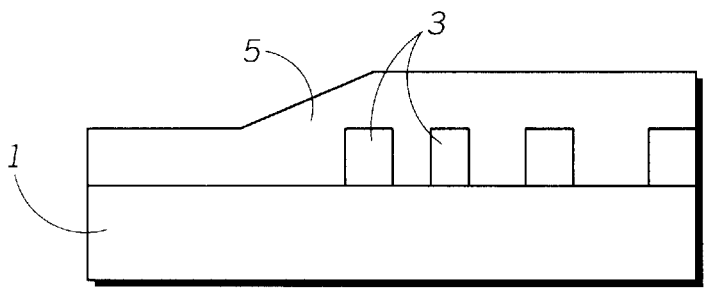
FIGS. 2 to 4 show the sequence of method steps according to the invention.
Figure 3:
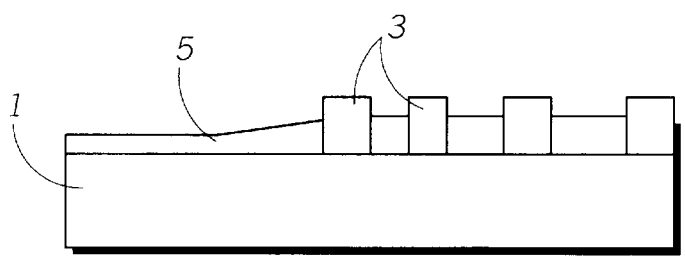
Figure 4:
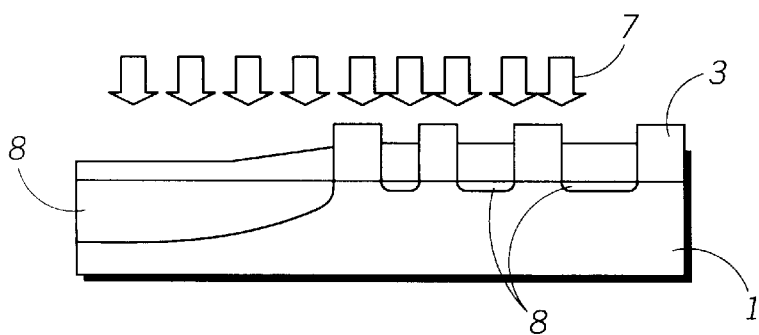

The method according to the present invention is summarized in FIG. 2 to FIG. 4. As can be seen in the figures a method is provided by the invention which enables the formation of different implant depth and doping areas at different locations on the semiconductor in a single lithography step. In other words, the number of implant steps is considerably decreased by controlled modulation of the resist thickness on the semiconductor.

In FIG. 2 a resist layer of spin on glass, polyimide, or low k dielectrics is coated on the semiconductor 1, where its thickness differs between dense and "void" areas. This difference depends among other influences on resist properties. After coating the semiconductor also the already existing elements 3 on its surface are covered by the resist.

In FIG. 3 the situation is shown after the resist has been exposed and developed. Due to the exposure and developing steps the resist 5 is at least partly removed so as to leave a layer of reduced thickness only between the elements 3 and the void parts on the semiconductor surface.

In FIG. 4 the effect of implantation with an ion beam 7 on the semiconductor bulk 1 is shown. The ions penetrate into the semiconductor 1 if and as far as they are not stopped by the remaining resist layer 5. Thus, the depth of implanted areas 8 differs in accordance with the thickness of the remaining resist layer 5. E.g. the implanted area 8 on the left hand side of FIG. 4 is deeper, since the resist thickness on the surface is small, than the implanted areas 8 between the elements 3, where a thicker layer 5 has remained.

The effect of a varying thickness of the layer 5 on the semiconductor 1 can even be increased by an optional resist etch back process in order to tailor the resist thickness as described above.

The overall number of implant layers is thus considerably decreased by the invention such that even the limitation of the method to special resists and the need of a good control of the resist is easily equaled out.

The present invention can also be described by a structure arrangement (cf. FIG. 4) on a semiconductor wafer 1 formed by lithography and subsequent ion implanting in the order of: depositing a resist layer 5 on a surface of said semiconductor wafer 1; exposing the resist layer 5 to light of a predetermined wavelength through a reticle and an optical system so as to form an image of said reticle on said semiconductor surface; developing and cleansing the surface of the semiconductor wafer 1 so as to remove at least partly the resist layer 5 depending on whether or not the resist layer had been exposed; implanting ions so as to determine the conductivity of the semiconductor in the cleansed areas of the semiconductor surface, wherein the surface energy of the resist 5 vs. the semiconductor 1 is chosen so as to accomplish a conglomeration of the resist depending on the density of the structures 2, 4 on the semiconductor surface.

What is claimed is:

1. A method of forming doped regions on a semiconductor wafer having a first area of low density structures and a second area of higher density structures, comprising the steps of:

depositing a resist layer on a surface of said semiconductor wafer at a relatively greater thickness in the second area and a relatively lesser thickness in the first area, and implanting ions through the resist layer so as to form the doped regions at a first depth in the first area and at a second depth in the second area, the second depth being greater than the first depth.

2. Method according to claim 1, wherein the resist comprises at least of one of spin on glass, polyimide, and low k dielectrics.

3. Method according to claim 1 or 2, wherein the resist is applied with a spin coater.

4. Method according to claim 1, further comprising a step of etching back the resist layer for reducing the thickness of the resist layer.

5. Method according to claim 1 which comprises additional steps of forming auxiliary non-functional structures on the semiconductor surface so as to determine the structure density.

6. Method according to claim 1 wherein the resist layer comprises a photosensitive resist.

* * * * *